United States Patent [19]

Barjhoux et al.

[11] 4,398,150

[45] Aug. 9, 1983

[54] IRONLESS HIGH-HOMOGENETY MAGNET AND ITS APPLICATION TO NUCLEAR MAGNETIC RESONANCE IMAGING

[75] Inventors: Yves M. Barjhoux, Orsay; Hervé Saint Jalmes, Paimpol; Jacques R. Taquin, Bures, all of France

[73] Assignee: Thomson - CSF, Paris, France

[21] Appl. No.: 231,213

[22] Filed: Feb. 2, 1981

[30] Foreign Application Priority Data

Feb. 5, 1980 [FR] France ............................... 80 02496

[51] Int. Cl.³ .......................................... G01R 33/08
[52] U.S. Cl. ..................................... 324/319; 324/318
[58] Field of Search ................ 324/300, 318, 320, 319

[56] References Cited

U.S. PATENT DOCUMENTS 2,856,579 10/1958 Packard ............................... 324/318
3,488,561 1/1970 Anderson ............................. 324/320

Primary Examiner—Michael J. Tokar
Attorney, Agent, or Firm—Roland Plottel

[57] ABSTRACT

The magnet essentially comprises at least three pairs of coaxial coils in order to increase the number of available parameters, to reduce the non-uniformity $B_d$, to provide an examination volume with a double access consisting of a longitudinal access along the axis of revolution Oz and of a transverse access parallel to the plane of symmetry, to minimize the overall size as well as the dissipated electric power. The nine principal characteristic parameters of the coils are chosen so as to optimize the uniformity of the magnetic field within the examination volume.

6 Claims, 2 Drawing Figures

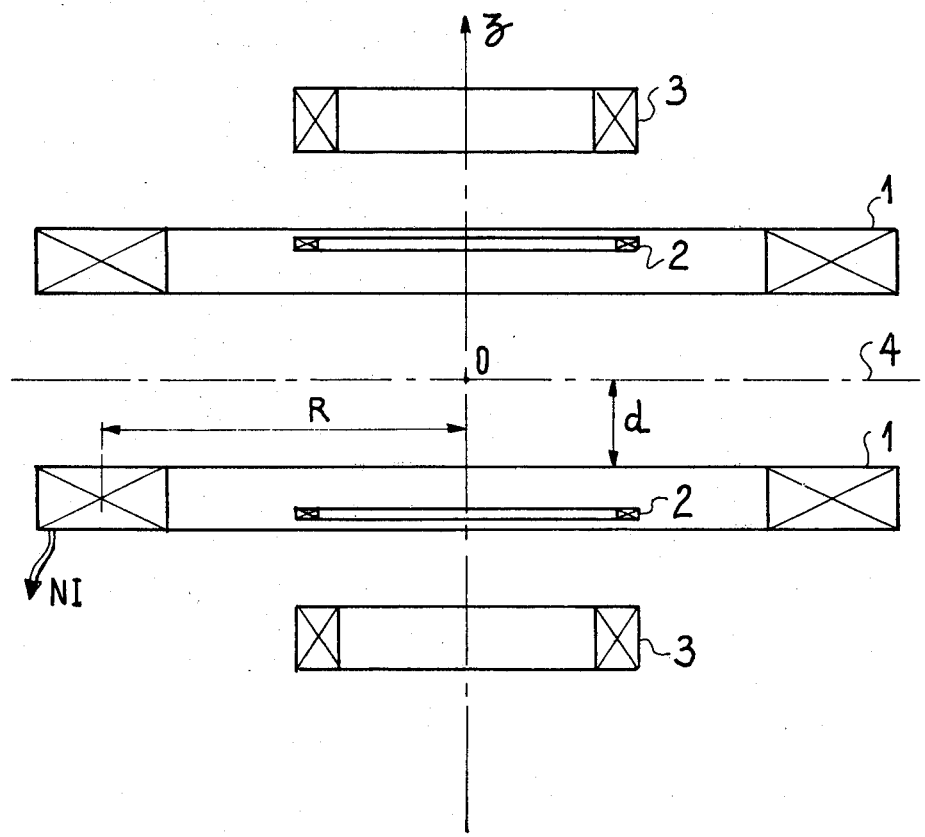
FIG_1

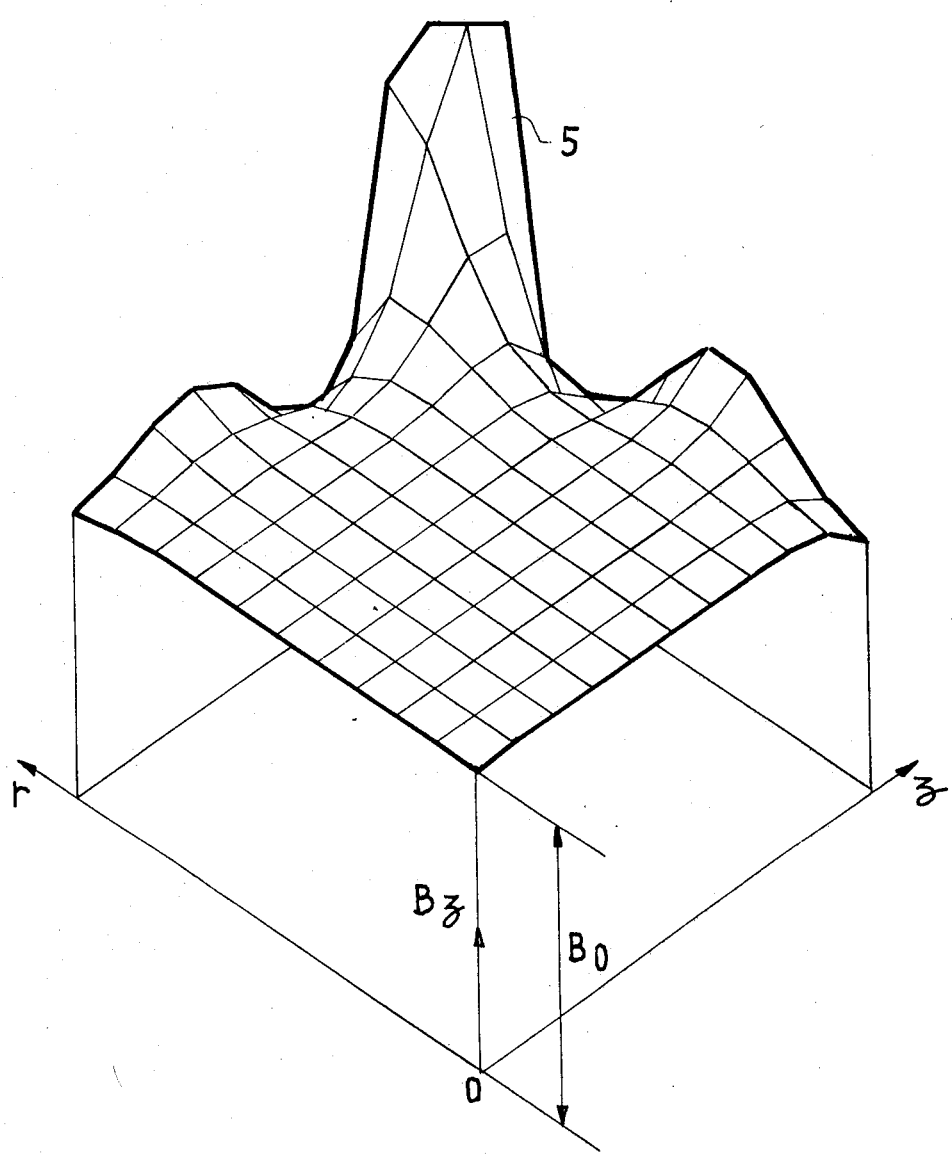

IRONLESS HIGH-HOMOGENETY MAGNET AND ITS APPLICATION TO NUCLEAR MAGNETIC RESONANCE IMAGING

This invention relates to a double-access magnet without magnetic circuit and providing high magnetic-field uniformity. The invention is particularly well suited to imagery produced by nuclear magnetic resonance (NMR).

The phenomenon of NMR has a wide range of potential uses and one of these is in the field of imagery.

The application of the NMR phenomenon to the whole human body and related aspects are being developed in the medical field by reason of a certain number of basic advantages. In the first place, and in contrast to X-rays, NMR examination does not have any harmful effect on living tissues. Secondly, it is possible to provide nuclear concentration data which are similar to the beam data employed for image reconstruction in the field of tomodensitometry. A further advantage to be emphasized lies in the potential uses of NMR in biochemical analysis which will permit detection in vivo of cancerous tumors, for example.

The prior art does in fact offer solutions to the problem of NMR imagery. Each exposure, however, entails the need for prohibitive exposure times of the order of one hour. Such lengths of time arise from the very low sensitivity of the NMR phenomenon. In fact, the NMR signal is masked by a very high level of thermal noise. One possible solution which will now be developed relates to the increase in uniformity of the orienting magnetic field $\vec{B_o}$. This magnetic field must orient the nuclear magnetic moments of the elementary particles which compose the body under examination and more especially protons. The field must therefore be relatively constant both in intensity and in direction throughout the examination region.

When non-uniformity or lack of homogeneity of the field $\vec{B_o}$ is sufficiently small, it is possible to apply field gradients of lower intensity for reconstruction of the image in order to reduce thermal noise. Moreover, the disappearance of many defects of field uniformity will reduce spatial distortions of the image.

The improvement in the NMR imagery which is thus achieved makes it possible to contemplate its application in the field of nondestructive testing of materials. For example, it will be possible to detect flaws resulting from defective manufacture in a part of plastic material. Thus it would also be possible, for example, to test evolutionary processes in flowing streams of fluid by means of a probe without thereby causing any disturbance.

The design solutions of the prior art therefore attached importance to the production of a magnetic field $\vec{B_o}$ having maximum uniformity throughout a volume which is comparable with that of the human body. However, the construction of a suitable magnet entails optimization of three characteristic parameters of the magnet:

the non-uniformity $B_d$ of the field $\vec{B_o}$;
the consumption of electric power and of coolant fluid and the overall size of the magnet;
the examination volume and its accessibility.

In the current state of the technique, the magnets proposed in order to obtain limited non-uniformity and enhanced ease of access to the examination volume are cumbersome and power-consuming assemblies. It is accordingly necessary to employ NMR application techniques having fairly low sensitivity such as the technique which involves the use of a NMR coil of the so-called "saddle" type.

By obtaining accessibility in two directions and an improved useful examination volume, the present invention permits enhanced field uniformity and a reduction both in power consumption and in overall size.

The magnet in accordance with the invention has high magnetic-field uniformity but no magnetic circuit and comprises an even number of electromagnetic coils of revolution which are symmetrical with respect to a plane of symmetry at right angles to their axis of revolution, each coil being defined by its characteristic parameters:

its excitation current NI,
its mean radius R,
the distance d between said coil and the plane of symmetry.

The magnet essentially comprises at least two pairs of coils in order to increase the number of available parameters with a view to reducing the non-uniformity $B_d$, in order to provide the examination volume with a double access consisting of a longitudinal access along the axis of revolution and of a transverse access parallel to the plane of symmetry, in order to minimize the overall size and also in order to minimize the dissipated electric power.

Other features of the invention will be more apparent upon consideration of the following description and accompanying drawings, wherein:

FIG. 1 is a diagram showing a configuration which consists of three parts of coils;

FIG. 2 is a stereogram representing the component $B_z$ of the magnetic field within the examination volume.

The prior art has evolved design solutions consisting of two pairs of coils. In fact, the field having the maximum attainable uniformity is produced by a sphere through which a current is passed. The prior art has therefore produced structures consisting of circular flat coils arranged in a sphere and having an axis of revolution which passes through the center of the sphere. The coils are arranged symmetrically in pairs with respect to a diametral plane of the sphere which passes through the center of this latter and is perpendicular to the axis of revolution.

It can be demonstrated that the component along the axis oz of the field in the vicinity of the origin of a system of this type is of the form:

$$B_z(z) = \vec{B_o} + B_2 \frac{z^2}{2!} + B_4 \frac{z^4}{4!} + B_6 \frac{z^6}{6!} + \cdots$$

which is a Taylor series development. The terms $B_k$ are the partial derivative number with respect to the axis of revolution Oz of the field $B_o$. The terms of odd order are zero by reason of the symmetry with respect to the plane 4 of the magnet. The terms of even order represent the defects in field uniformity.

The object to be achieved is the cancellation of the first successive terms of even order and the minimization of the residual terms which will establish the degree of field uniformity.

Existing configurations comprising two pairs of coils will make it possible to reduce the derivatives of order 2, 4 and 6 to zero. We will thus have in the vicinity of the origin:

$$B_z(z) = \vec{B_o} + B_8 \frac{z^8}{8!} + B_{10}\frac{z^{10}}{10!} + \ldots$$

The non-uniformity $B_d$ arises in principle solely from the terms having an order which is higher than or equal to eight. Reduction to zero is obtained by adjusting the values of the six characteristic parameters of the coils. In configurations of this type, however, access to the center is possible only in the longitudinal direction.

In order to obtain move convenient access to the examination volume, it would be necessary to construct a similar system of much larger size. These solutions would not only become highly cumbersome but would also consume large amounts of electric power as well as coolant fluid.

In the preferred embodiment herein described, the present invention makes it possible to overcome these disadvantages and to improve the uniformity of the field $\vec{B_o}$ to an even greater extent.

The configuration shown in FIG. 1 comprises the three pairs of its coil 1, 2 and 2. Each coil 3 is placed within the interior of the coils 1. The two reference element are shown, namely the plane of symmetry 4 and the axis of revolution Oz. The intersection of these latter and the origin of the system is designated by the point O. The three characteristic parameters of the pair of coils 1 are: the excitation current, the radius R and the distance d from the center of a coil to the origin O.

Each coil is designed in the form of two stacks of spiral turns:
a main stack,
a field-adjusting stack.

By means of this configuration, provision is made for three additional characteristic parameters which serve theoretically to reduce to zero the terms $B_{2n}$ of order lower than or equal to 14. In the preferred example of construction, the terms of order lower than or equal to 10 are reduced exactly to zero and the residual terms are minimized. There is thus obtained in the vicinity of the origin O:

$$B_z(z) = \vec{B_o} + B_{12}\frac{z^{12}}{12!} + B_{14}\frac{z^{14}}{14!} + \ldots$$

It is also possible to demonstrate theoretically and to establish experimentally that the reduction of residual terms in the Taylor series development of $B_z$ along the axis Oz also produces a reduction of the residual terms in a development which is generalized to include an entire examination volume.

FIG. 2 is a stereogram which represents the amplitude of the magnetic-field component $B_z(z,r)$ in the three-pair coil configuration of the magnet in accordance with the invention. This figure represents the value of the field in one-quarter of the examination volume. A substantial peak 5 is visible externally of the examination volume. Residual defects of uniformity are confined to the limits of the examination volume.

The magnet configuration in accordance with the invention is therefore particularly advantageous. It permits greater freedom of choice in regard to the characteristic parameters of the coils 1, 2 and 3 while optimizing the three characteristic parameters of the magnet. It is noted that the power consumption and overall size are reduced to a substantial extent with respect to the possible designs of the prior art.

The magnet in accordance with the invention permits:
a longitudinal access along the axis of revolution Oz,
a transverse access in the plane of symmetry 4.

The magnet is therefore particularly well suited to NMR examinations of bodies of substantial size.

It is possible to employ more than three pairs of coils. A greater number of parameters are accordingly available for reducing defects of field uniformity and if necessary for increasing the examination volume.

The present invention therefore permits transverse examination in particular. This arrangement of the body to be examined is advantageous within the scope of another invention disclosed in a French patent Application and filed by the same Applicants on the same date as the present invention.

The invention is also particularly suited to nondestructive testing of structures having different shapes and sizes by virtue of the enlarged examination volume, the double access and the reduced overall size of the magnet.

What is claimed is:

1. An ironless magnet having high field uniformity comprising an even number of electromagnetic coils of revolution which are symmetrical with respect to a plane of symmetry at right angles to their axis of revolution, each coil being defined by its characteristic parameters:
   its excitation current NI,
   its means radius R,
   the distance d between said coil and the plane of symmetry; said magnet comprises at least two pairs of coils for increasing the number of available parameters and reducing the non-uniformity $B_b$ of the magnetic field; said coils defining an examination volume with a double access consisting of a longitudinal access along the axis of revolution and of a transverse access parallel to the plane of symmetry, thereby reducing the overall size and also the dissipated electric power of said magnets.

2. A magnet according to claim 1, wherein said magnet is constituted by three pairs of coils.

3. A magnet according to claim 2, wherein one of the pairs of coils is located within the interior of that pair of coils which is nearest the examination volume.

4. A magnet according to claim 1, wherein each coil is made up of main turns and adjustment turns which are employed for adjusting the uniformity of the magnetic field.

5. A magnet according to claim 1, wherein said magnet is employed in an examination system which utilizes nuclear magnetic resonance for producing the orienting magnetic field $B_o$ in which the body to be examined is placed.

6. An ironless magnet having high field uniformity and comprising an examination space for submitting a body to this field, comprising a set of electromagnetic coils for revolution which are symmetrically arranged in pairs with respect to a plane of symmetry at right angles to their axis of revolution, each coil being defined by its characteristic parameters: its excitation current NI, its mean radius R and its distance d to the plane of symmetry, wherein said magnet comprises at least three pairs of coils, said space having a double access one on one side and the other on the other of the plane of symmetry, and said space being delimited by opposite faces of the pair of coils the nearest from said plane of symmetry.

* * * * *